(12) United States Patent
Hsu et al.

(10) Patent No.: US 8,406,433 B2
(45) Date of Patent: Mar. 26, 2013

(54) 3-POINT POSITIONING DEVICE AND METHOD THEREOF

(75) Inventors: En-Feng Hsu, Hsin-Chu (TW);
Hsin-Chi Cheng, Hsin-Chu (TW);
Chih-Hung Lu, Hsin-Chu (TW);
Ming-Tsan Kao, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 278 days.

(21) Appl. No.: 12/768,728

(22) Filed: Apr. 28, 2010

(65) Prior Publication Data

US 2010/0284548 A1 Nov. 11, 2010

Related U.S. Application Data

(60) Provisional application No. 61/176,488, filed on May 8, 2009.

(30) Foreign Application Priority Data

Sep. 23, 2009 (TW) .............................. 98132083 A (51) Int. Cl.
*H03G 3/00* (2006.01)
*G09G 5/00* (2006.01)

(52) U.S. Cl. ........................................ 381/107; 345/156

(58) Field of Classification Search .................. 381/107, 381/306; 382/152, 216, 291, 295, 312; 356/614; 345/589, 419, 421, 157; 359/30; 463/39
See application file for complete search history.

(56) References Cited

U.S. PATENT DOCUMENTS

| | | | |
|---|---|---|---|
| 5,386,478 A * | 1/1995 | Plunkett ........................ | 381/103 |
| 6,580,810 B1 | 6/2003 | Yang et al. | |
| 2005/0254106 A9 * | 11/2005 | Silverbrook et al. .......... | 358/539 |
| 2006/0082546 A1 | 4/2006 | Wey | |
| 2008/0096654 A1 | 4/2008 | Mondesir | |
| 2008/0117167 A1 * | 5/2008 | Aonuma et al. ............... | 345/157 |
| 2008/0239428 A1 * | 10/2008 | Bell et al. ......................... | 359/30 |
| 2009/0033623 A1 | 2/2009 | Lin | |
| 2010/0149073 A1 * | 6/2010 | Chaum et al. ..................... | 345/8 |
| 2010/0245532 A1 * | 9/2010 | Kurtz et al. ................. | 348/14.03 |

FOREIGN PATENT DOCUMENTS

| | | |
|---|---|---|
| JP | 200335515 | 2/2003 |
| TW | 413795 | 12/2000 |
| TW | 200907764 | 2/2009 |

* cited by examiner

*Primary Examiner* — Fan Tsang
*Assistant Examiner* — Eugene Zhao
(74) *Attorney, Agent, or Firm* — Winston Hsu; Scott Margo (57) ABSTRACT

A 3-point positioning device senses a scene including an auxiliary positioning module by means of an image sensor, and accordingly generates a sensed image. The auxiliary positioning module comprises a first, a second, and a third auxiliary positioning units. By means of the sensed image, the 3-point positioning device recognizes a first, a second, and a third sensing units of the image sensor corresponding to the first, the second, and the third auxiliary positioning units. In this way, the 3-point positioning device can calculate out an absolute location of the auxiliary positioning module according to the locations or the received power of the first, the second, and the third sensing units.

30 Claims, 8 Drawing Sheets

3-POINT POSITIONING DEVICE AND METHOD THEREOF

CROSS REFERENCE TO RELATED APPLICATIONS

This application claims the benefit of U.S. Provisional Application No. 61/176,488, filed on May 8, 2009 and entitled "optical distance and angle measurement with three light sources" the contents of which are incorporated herein.

BACKGROUND OF THE INVENTION

1. Field of the Invention

The present invention is related to a positioning device, and more particularly, to a 3-point positioning device.

2. Description of the Prior Art

The conventional positioning device has been applied in the TV games or the computer games for the user having a better interactive experience. For example, in the Wii gaming console of Nintendo, the Wii joystick includes a conventional positioning device, so that the Wii game console can obtain the move distance and the move direction of the Wii joystick relative to a measured object (for instance, a display or a displaying screen), and the Wii game console can control the game proceeding according to the move distance and the move direction. Take a tennis game for example. When the user swings the Wii joystick, the Wii game console can obtain the relative move direction and the relative move distance of the Wii joystick by means of the conventional positioning device, so that the role controlled by the user can accordingly swing the tennis racket for hitting the ball. For instance, the longer the relative move distance per second obtained by the Wii game console is, the stronger the strength of the role hitting the ball is. Consequently, the flying speed of the ball is faster. Otherwise, the shorter the relative move distance per second obtained by the Wii game console is, the weaker the strength of the role hitting the ball is. Consequently, the flying speed of the ball is slower. In addition, the Wii game console can control the role corresponding to the user doing a forehand or a backhand tennis action according to the relative move direction.

SUMMARY OF THE INVENTION

The present invention provides a 3-point positioning device. The 3-point positioning device comprises an auxiliary positioning module, an image sensor, and a location-calculating circuit. The auxiliary positioning module comprises a first auxiliary positioning unit, a second auxiliary positioning unit, and a third auxiliary positioning unit. A first auxiliary positioning line is formed between the first auxiliary positioning unit and the second auxiliary positioning unit. A length of the first auxiliary positioning line is equal to a first predetermined distance. A second auxiliary positioning line is formed between the second auxiliary positioning unit and the third auxiliary positioning unit. A length of the second auxiliary positioning line is equal to a second predetermined distance. An included angle between the first and the second auxiliary positioning lines is a predetermined included angle. The image sensor is utilized for sensing a scene having a range including the first, the second, and the third auxiliary positioning units, and accordingly generating a sensed image. The range of the scene is determined by a predetermined view angle of the image sensor. The location-calculating circuit is utilized for receiving the sensed image so as to recognize a first sensing unit of the image sensor corresponding to the first auxiliary positioning unit, a second sensing unit of the image sensor corresponding to the second auxiliary positioning unit, and a third sensing unit of the image sensor corresponding to the third auxiliary positioning unit, and calculating out a measured distance and a measured angle between the auxiliary positioning module and the image sensor according the first, the second, and the third sensing units so as to accordingly output a distance/angle signal.

The present invention further provides a method of 3-point positioning. The method comprises providing a first, a second, and a third auxiliary positioning units of an auxiliary positioning module, and an image sensor, the image sensor sensing a scene for generating a sensed image, recognizing a first sensing unit of the image sensor corresponding to the first auxiliary positioning unit, a second sensing unit of the image sensor corresponding to the second auxiliary positioning unit, and a third sensing unit of the image sensor corresponding to the third auxiliary positioning unit, according to the sensed image, and calculating out a measured distance and a measured angle between the image sensor and the auxiliary positioning module according to the first, the second, and the third sensing units. The first, the second, and the third auxiliary positioning units are in a range of the scene. A first auxiliary positioning line is formed between the first auxiliary positioning unit and the second auxiliary positioning unit. A length of the first auxiliary positioning line is equal to a first predetermined distance. A second auxiliary positioning line is formed between the second auxiliary positioning unit and the third auxiliary positioning unit. A length of the second auxiliary positioning line is equal to a second predetermined distance. An included angle between the first and the second auxiliary positioning lines is a predetermined included angle.

These and other objectives of the present invention will no doubt become obvious to those of ordinary skill in the art after reading the following detailed description of the preferred embodiment that is illustrated in the various figures and drawings.

DETAILED DESCRIPTION

For the user having a better interactive experience, the present invention provides a 3-point positioning device capable of calculating out the absolute location of the user. In this way, the game console can provide a more realistic interactive experience according to the absolute location measured by the 3-point positioning device of the present invention.

Figure 1:
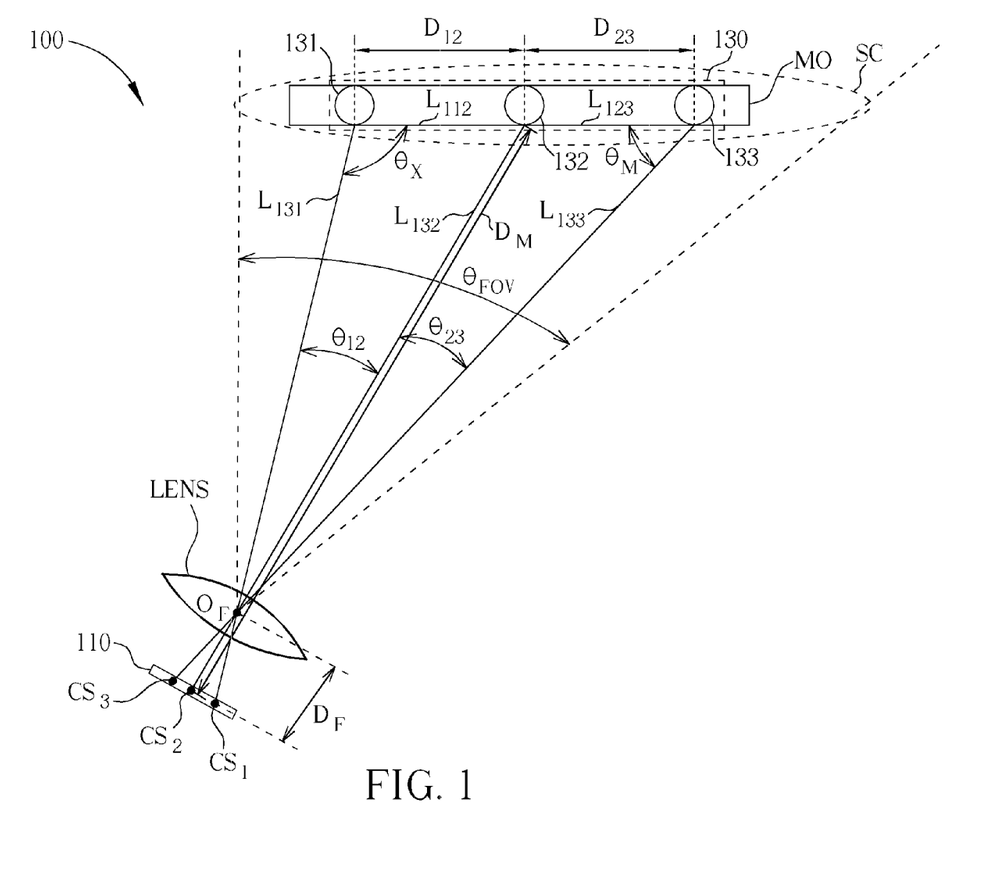
FIG. 1 is a diagram illustrating a 3-point positioning device according to a first embodiment of the present invention.

Please refer to FIG. 1. FIG. 1 is a diagram illustrating a 3-point positioning device 100 according to a first embodiment of the present invention. The 3-point positioning device 100 comprises an image sensor 110, a location-calculating circuit 120 (not shown in FIG. 1), and an auxiliary positioning module 130. The 3-point positioning device 100 is utilized for measuring a measured distance $D_M$ and a measured angle $\theta_M$ between the auxiliary positioning module 130 and the image sensor 110. When the auxiliary positioning module 130 and a measured object MO are disposed at the same location, the 3-point positioning device 100 can measure the measured distance $D_M$ and the measured angle $\theta_M$ between the measured object MO and the 3-point positioning device 100. For example, the measured object MO is a display or a displaying screen. When the image sensor 110 and the user are at the same location (for instance, the user holds the image sensor 110 of the 3-point positioning device 100), the distance between the user and the display (the measured object MO) can be obtained by the 3-point positioning device 100.

The auxiliary positioning module 130 comprises auxiliary positioning units 131, 132, and 133. The auxiliary positioning units 131, 132, and 133 have the characteristics of recognition. For example, the auxiliary positioning units 131, 132, and 133 are Light-Emitting Diodes (LED) having a specific wavelength or a specific frequency (for instance, LEDs of infrared light), or, the auxiliary positioning units 131, 132, and 133 are objects having a specific pattern or a specific color, for the 3-point positioning device 100 to recognize the auxiliary positioning units 131, 132, and 133 in the sensed image signals of the image sensor 110. In the present embodiment, the auxiliary positioning units 131, 132, and 133 are disposed on the measured object MO. An auxiliary positioning line $L_{112}$ is formed between the auxiliary positioning units 131 and 132. The length of the auxiliary positioning line $L_{112}$ is equal to a predetermined distance $D_{12}$; an auxiliary positioning line $L_{123}$ is formed between the auxiliary positioning units 132 and 133. The length of the auxiliary positioning line $L_{123}$ is equal to a predetermined distance $D_{23}$. The auxiliary positioning line $L_{112}$ is parallel to the auxiliary positioning line $L_{123}$.

The image sensor 110 is utilized for sensing a scene SC so as to generate a sensed image I. The sensed image I comprises image signals $S_{I1} \sim S_{IM}$. As shown in FIG. 1, the range of the scene SC that the image sensor 110 can sense is determined by a predetermined view angle $\theta_{FOV}$ of the image sensor 110. The predetermined view angle $\theta_{FOV}$ of the image sensor 110 corresponds to the Field of View (FOV) of the image sensor 110. The image sensor 110 comprises sensing units $CS_1 \sim CS_M$, wherein M represents a positive integer. Each sensing unit $CS_1 \sim CS_M$ of the image sensor 110 senses a corresponding part of the scene SC for generating the image signals $S_{I1} \sim S_{IM}$ of the sensed image I. For example, as shown in FIG. 1, the auxiliary positioning module is in the range of the scene SC. The sensing unit $CS_1$ senses the auxiliary positioning unit 131 in the range of the scene SC for generating the image signal $S_{I1}$; the sensing unit $CS_2$ senses the auxiliary positioning unit 132 in the range of the scene SC for generating the image signal $S_{I2}$; the sensing unit $CS_3$ senses the auxiliary positioning unit 133 in the range of the scene SC for generating the image signal $S_{I1}$. In addition, the lens LENS in FIG. 1 is utilized for focusing the light to the image sensor 110 so that the image sensor 110 can generate the sensed image I.

Furthermore, the measured distance $D_M$ in FIG. 1 is illustrated to be the distance between the sensing unit $CS_2$ and the auxiliary positioning unit 132 for example. However, the measured distance $D_M$ can be a distance between the sensing unit $CS_1$ and the auxiliary positioning unit 131, or a distance between the sensing unit $CS_3$ and the auxiliary positioning unit 133. Similarly, the measured angle $\theta_M$ of FIG. 1 is illustrated to be an included angle between the connecting line (formed between the sensing unit $CS_2$ and the auxiliary positioning unit 132), and the auxiliary positioning line $L_{123}$, an included angle between the connecting line (formed between the sensing unit $CS_2$ and the auxiliary positioning unit 132) and the auxiliary positioning line $L_{112}$, or a included angle between the connecting line (formed between the sensing unit $CS_1$ and the auxiliary positioning unit 131) and the auxiliary positioning line $L_{112}$.

The location-calculating circuit 120 is utilized for receiving the sensed image I (the image signals $S_{I1} \sim S_{IM}$) so as to recognize the sensing unit $CS_1$ corresponding to the auxiliary positioning unit 131, the sensing unit $CS_2$ corresponding to the auxiliary positioning unit 132, and the sensing unit $CS_3$ corresponding to the auxiliary positioning unit 133. The location-calculating circuit 120 calculates out the measured distance $D_M$ and the measured angle $\theta_M$ according to the sensing units $CS_1$, $CS_2$, and $CS_3$, and accordingly generates a distance/angle signal $S_{D/A}$. The operational principle of the location-calculating circuit 120 is illustrated in detail as below.

In FIG. 1, a projection line $L_{131}$ is formed between the sensing unit $CS_1$ and the auxiliary positioning units 131; a projection line $L_{132}$ is formed between the sensing unit $CS_2$ and the auxiliary positioning units 132; a projection line $L_{133}$ is formed between the sensing unit $CS_3$ and the auxiliary positioning units 133. The measured distance $D_M$ is defined as the distance between the sensing unit $CS_2$ and the auxiliary positioning unit 132. The measured distance $\theta_M$ is an included angle between the projection line $L_{133}$ and the auxiliary positioning line $L_{123}$. The projection lines $L_{131}$, $L_{132}$, and $L_{133}$ cross with each other at a crossing point $O_F$. The location of the crossing point $O_F$ is around at the center of the lens LENS. The distance between the crossing point $O_F$ and the image sensor 110 is $D_F$. In addition, since the distance between the sensing unit $CS_2$ and the auxiliary positioning unit 132 is approximately equal to the distance between the crossing point $O_F$ and the auxiliary positioning unit 132, the measured distance $D_M$ can represent not only the distance between the sensing unit $CS_2$ and the auxiliary positioning unit 132 but also the distance between the crossing point $O_F$ and the auxiliary positioning unit 132. The included angle between the projection lines $L_{131}$ and $L_{132}$ is defined as the projection included angle $\theta_{12}$; the included angle between the projection lines $L_{132}$ and $L_{133}$ is defined as the projection included angle $\theta_{23}$. Since the projection lines $L_{131}$ and $L_{132}$, and the measured object MO (or the auxiliary positioning lines $L_{112}$ and $L_{123}$) form a triangle, the magnitude of the included angle $\theta_X$ between the projection line $L_{131}$ and the measured object MO (or the auxiliary positioning lines $L_{112}$ and $L_{123}$) is equal to $(\pi - \theta_M - \theta_{12} - \theta_{23})$, wherein $\pi$ represents a sum of three internal angles of a triangle.

The relation between the measured distance $D_M$, the predetermined distance $D_{12}$, the predetermined distance $D_{23}$, the measured angle $\theta_M$, and the projection included angles $\theta_{12}$ and $\theta_{23}$ can be represented as the following formulas according to the sine theorem:

$$D_{12}/\sin \theta_{12} = D_M/\sin \theta_X = D_M/\sin(\pi - \theta_M - \theta_{12} - \theta_{23}) \quad (1);$$

$$D_{23}/\sin \theta_{23} = D_M/\sin \theta_M = D_M/\sin \theta_M \quad (2);$$

therefore, as long as the location-calculating circuit 120 can obtain the magnitudes of the projection included angles $\theta_{12}$ and $\theta_{23}$, the measured distance $D_M$ and the measured angle $\theta_M$ can be calculated out according to the formulas (1) and (2).

Please refer to FIG. 2, FIG. 3, FIG. 4, and FIG. 5. FIG. 2, FIG. 3, FIG. 4, and FIG. 5 are diagrams illustrating a method of calculating out the projection included angles $\theta_{12}$ and $\theta_{23}$ according to the present invention. The end point projected by the crossing point $O_F$ on the image sensor 110 is the middle point $P_F$ of the image sensor 110. A middle line $L_F$ is formed between the crossing point $O_F$ and the middle point $P_F$, and the length of the middle line is equal to the predetermined distance $D_F$. The middle line $L_F$ is perpendicular to the surface of the image sensor 110.

Figure 2:
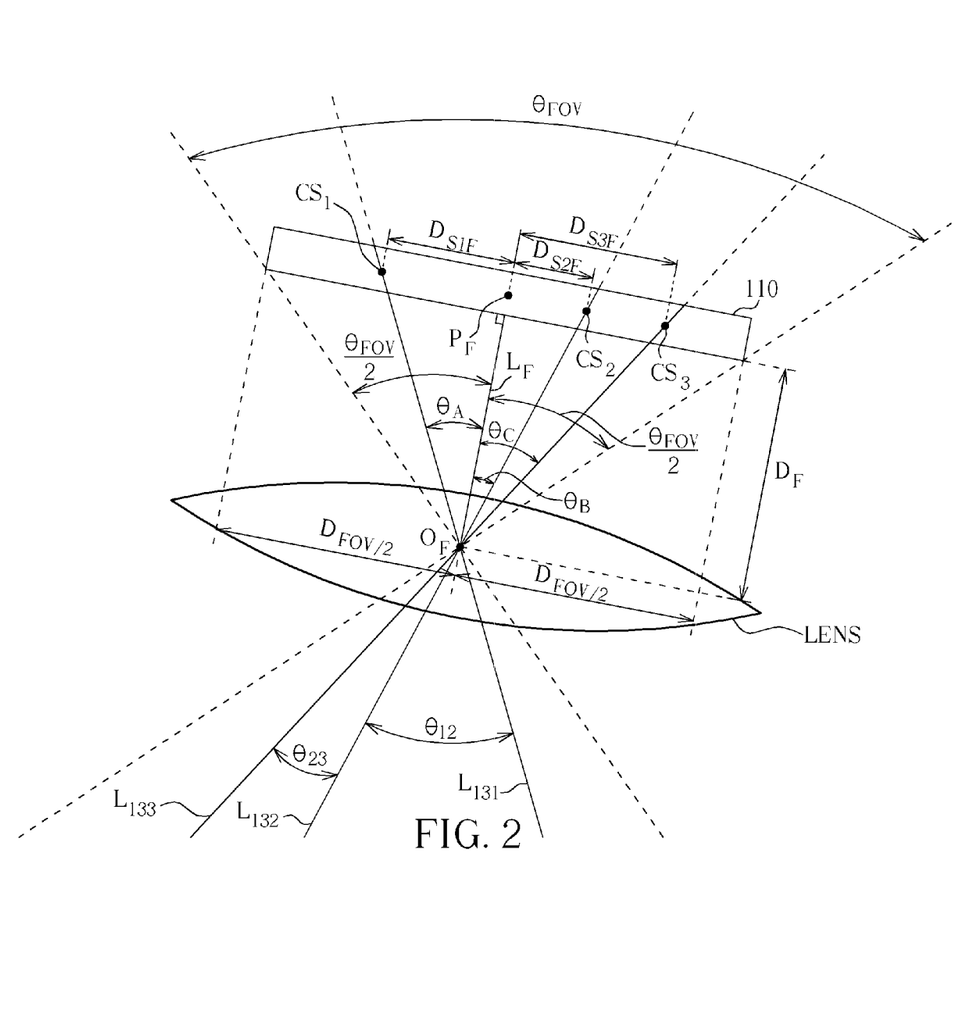
FIG. 2, FIG. 3, FIG. 4, and FIG. 5 are diagrams illustrating a method of calculating out the projection included angles and according to the present invention.

In FIG. 2, the middle point $P_F$ is between the sensing units $CS_1$ and $CS_2$. The distance between the sensing unit $CS_1$ and the middle point $P_F$ is $D_{S1F}$, and the distance $D_{S1F}$ can be obtained by means of summing the widths of the sensing units between the sensing unit $CS_1$ and the middle point $P_F$; the distance between the sensing unit $CS_2$ and the middle point $P_F$ is $D_{S2F}$, and the distance $D_{S2F}$ can be obtained by means of summing the widths of the sensing units between the sensing unit $CS_2$ and the middle point $P_F$; the distance between the sensing unit $CS_3$ and the middle point $P_F$ is $D_{S3F}$, and the distance $D_{S3F}$ can be obtained by means of summing the widths of the sensing units between the sensing unit $CS_3$ and the middle point $P_F$. In addition, the distance $D_{FOV/2}$ is a half of the width of the image sensor 110, and the distance $D_{FOV/2}$ can be obtained by means of summing the widths of the sensing units at the left or the right sides of the middle point $P_F$. Thus, the middle-line included angle $\theta_A$ between the middle line $L_F$ and the projection line $L_{131}$, the middle-line included angle $\theta_B$ between the middle line $L_F$ and the projection line $L_{132}$, and the middle-line included angle $\theta_C$ between the middle line $L_F$ and the projection line $L_{133}$ can be represented as the following formulas:

$$\theta_A = \tan^{-1}[\tan(\theta_{FOV}/2) \times (D_{S1F}/D_{FOV/2})] \quad (3);$$

$$\theta_B = \tan^{-1}[\tan(\theta_{FOV}/2) \times (D_{S2F}/D_{FOV/2})] \quad (4);$$

$$\theta_C = \tan^{-1}[\tan(\theta_{FOV}/2) \times (D_{S3F}/D_{FOV/2})] \quad (5);$$

hence, the location-calculating circuit 120 can recognize the sensing units $CS_1$, $CS_2$, and $CS_3$ respectively corresponding to the auxiliary positioning units 131, 132, and 133 according to the sensed image I. Then the location-calculating circuit 120 obtains the distances $D_{S1F}$, $D_{S2F}$, and $D_{S3F}$ according to the locations of the sensing units $CS_1$, $CS_2$, and $CS_3$. The middle-line included angles $\theta_A$, $\theta_B$, and $\theta C$ can be calculated out according to the formulas (3), (4), and (5). Since the projection included angle $\theta_{12}$ is equal to $(\theta_A + \theta_B)$ and the projection included angle $\theta_{23}$ is equal to $(\theta_C - \theta_B)$, as shown in FIG. 2, the location-calculating circuit 120 can calculate out the projection included angles $\theta_{12}$ and $\theta_{23}$. In this way, the location-calculating circuit 120 can calculate out the measured distance $D_M$ and the measured angle $\theta_M$ according to the formulas (1) and (2).

Figure 3:
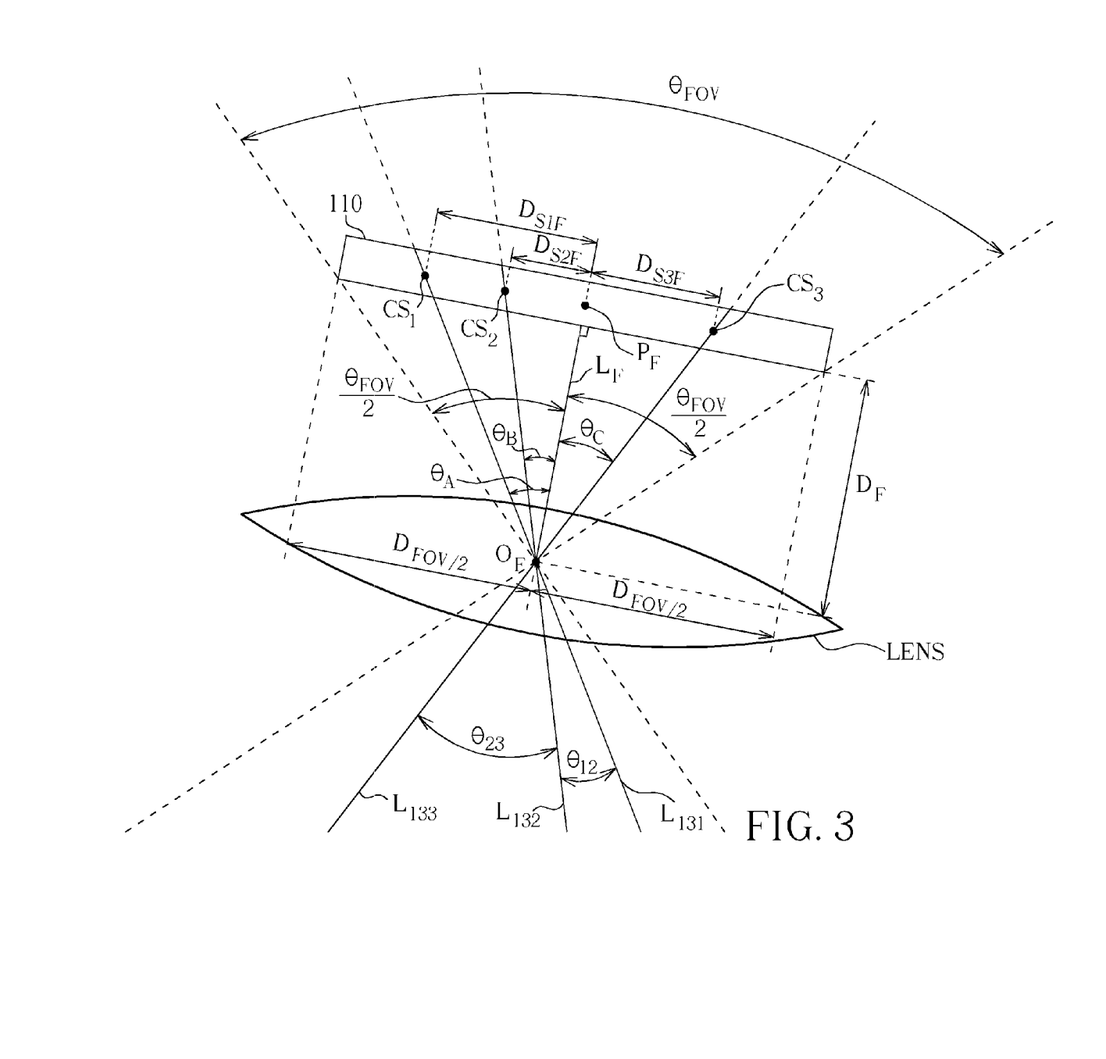

In FIG. 3, the method of calculating out the middle-line included angles $\theta_A$, $\theta_B$, and $\theta_C$ is similar to the method illustrated in FIG. 2. However, comparing with FIG. 2, in FIG. 3, the middle point $P_F$ is between the sensing units $CS_2$ and $CS_3$. Meanwhile, the projection included angle $\theta_{12}$ is equal to $(\theta_A - \theta_B)$ and the projection included angle $\theta_{23}$ is equal to $(\theta_C + \theta_B)$. In this way, the location-calculating circuit 120 can calculate out the middle-line included angles $\theta_A$, $\theta_B$, and $\theta_C$ according to the formulas (3), (4), and (5), and then calculate out the measured distance $D_M$ and the measured angle $\theta_M$ according to the formulas (1) and (2).

Figure 4:
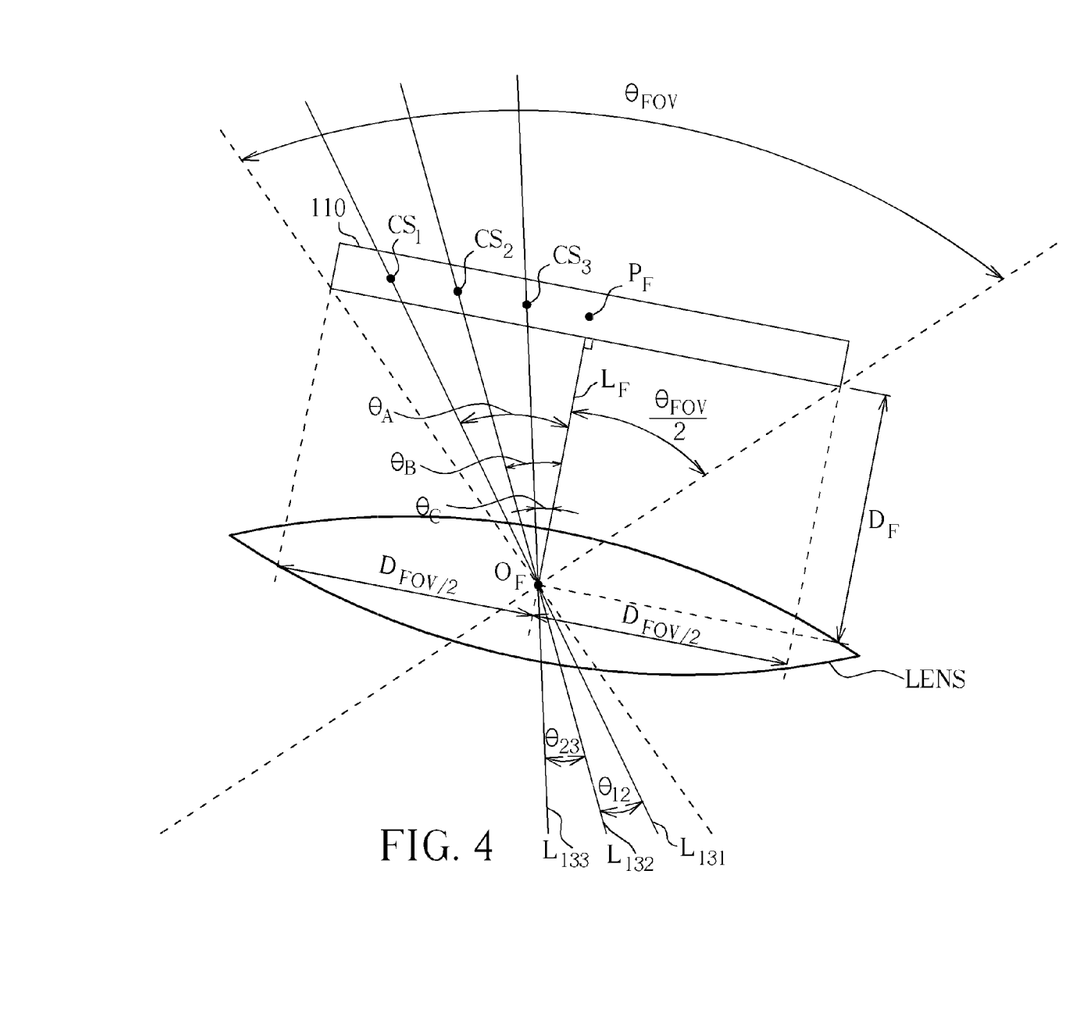

In FIG. 4, the method of calculating out the middle-line included angles $\theta_A$, $\theta_B$, and $\theta_C$ is similar to the method illustrated in FIG. 2. However, comparing with FIG. 2, in FIG. 4, the sensing units $CS_1$, $CS_2$ and $CS_3$ are all at the left side of the middle point $P_F$, and $\theta_C < \theta_B < \theta_A$. Also, the projection included angle $\theta_{12}$ is equal to $(\theta_A - \theta_B)$ and the projection included angle $\theta_{23}$ is equal to $(\theta_B - \theta_C)$. In this way, the location-calculating circuit 120 can calculate out the middle-line included angles $\theta_A$, $\theta_B$, and $\theta_C$ according to the formulas (3), (4), and (5), and then calculate out the measured distance $D_M$ and the measured angle $\theta_M$ according to the formulas (1) and (2).

Figure 5:
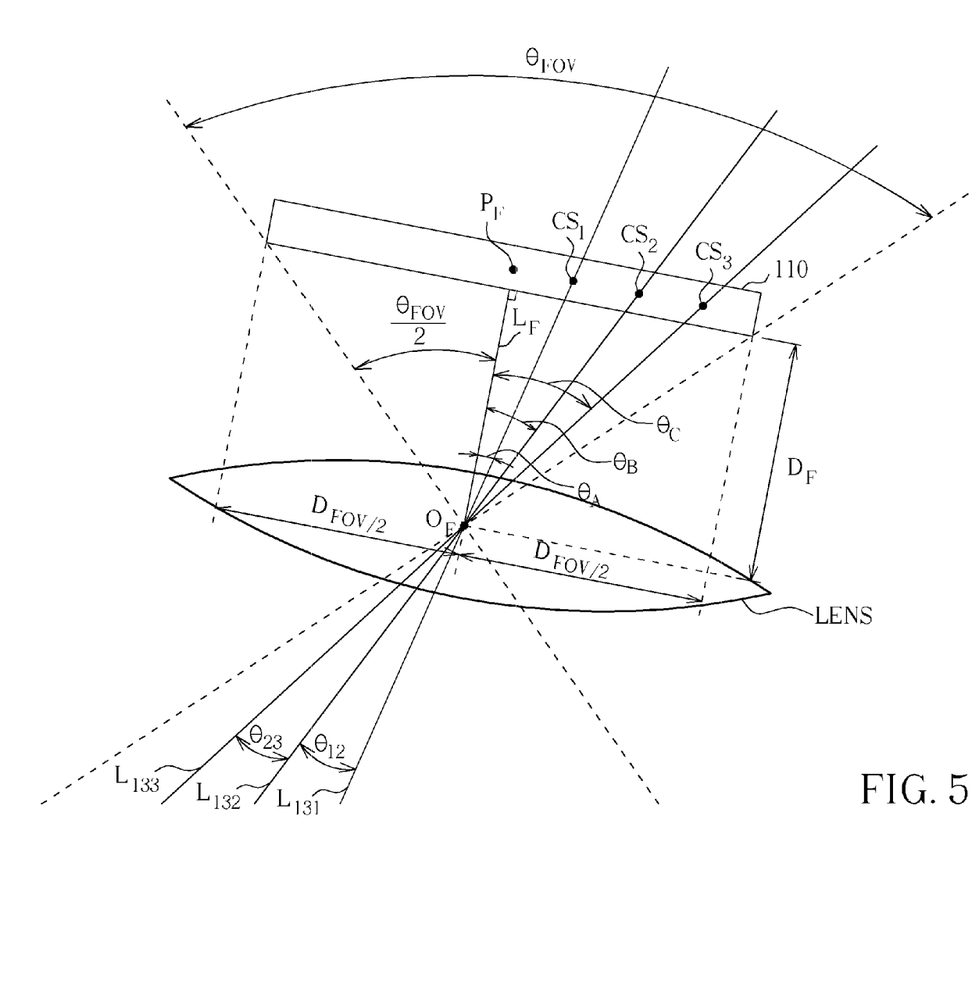

In FIG. 5, the method of calculating out the middle-line included angles $\theta_A$, $\theta_B$, and $\theta_C$ is similar to the method illustrated in FIG. 2. However, comparing with FIG. 2, in FIG. 5, the sensing units $CS_1$, $CS_2$ and $CS_3$ are all at the right side of the middle point $P_F$, and $\theta_A < \theta_B < \theta_C$. Also, the projection included angle $\theta_{12}$ is equal to $(\theta_B - \theta_A)$ and the projection included angle $\theta_{23}$ is equal to $(\theta_C - \theta_B)$. In this way, the location-calculating circuit 120 can calculate out the middle-line included angles $\theta_A$, $\theta_B$, and $\theta_C$ according to the formulas (3), (4), and (5), and then calculate out the measured distance $D_M$ and the measured angle $\theta_M$ according to the formulas (1) and (2).

Figure 6:
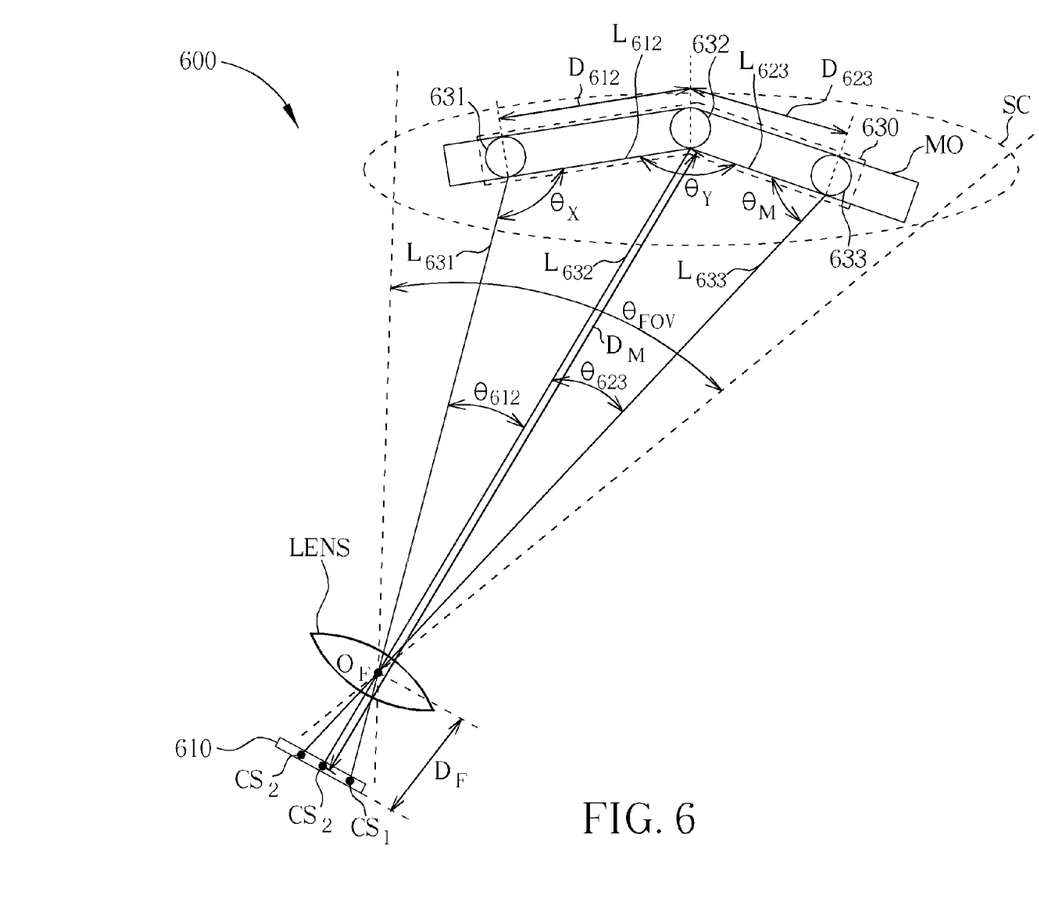
FIG. 6 is a diagram illustrating a 3-point positioning device according to the second embodiment of the present invention.

Please refer to FIG. 6. FIG. 6 is a diagram illustrating a 3-point positioning device 600 according to the second embodiment of the present invention. The structure and the operation principle of the 3-point positioning device 600 are similar to those of the 3-point positioning device 100. However, comparing with the 3-point positioning device 100, in the 3-point positioning device 600, the auxiliary positioning units 631, 632, and 633 are not disposed on the same line. The auxiliary positioning line $L_{612}$ between the auxiliary positioning units 631 and 632 is not parallel to the auxiliary positioning line $L_{623}$ between the auxiliary positioning units 632 and 633. The angle included by the auxiliary positioning lines $L_{612}$ and $L_{623}$ is a predetermined included angle $\theta_Y$. Since the auxiliary positioning lines $L_{612}$ and $L_{623}$, and the projection lines $L_{631}$ and $L_{632}$ form a quadrangle, the magnitude of the angle included between the projection line $L_{631}$ and the auxiliary positioning lines $L_{612}$ is equal to $(2 \times \pi - \theta_M - \theta_{612} - \theta_{623} - \theta_Y)$. In this way, the relation between the measured distance $D_M$, the predetermined distance $D_{612}$, the predetermined distance $D_{623}$, the measured angle $\theta_M$, and the projection included angles $\theta_{612}$ and $\theta_{623}$ can be represented as the following formulas according to the sine theorem:

$$D_{612}/\sin\theta_{612} = D_M/\sin\theta_X = D_M/\sin(2\times\pi - \theta_M - \theta_{612} - \theta_{623} - \theta_Y) \quad (6);$$

$$D_{623}/\sin\theta_{623} = D_M/\sin\theta_M = D_M/\sin\theta_M \quad (7);$$

since the angles $\theta_{612}$ and $\theta_{612}$ can be calculated out by means of the method illustrated in FIG. 2, FIG. 3, FIG. 4, and FIG. 5, and the predetermined distance $D_{612}$ and $D_{623}$ is known, the 3-point positioning device 600 can calculate out the measured distance $D_M$ and the measured angle $\theta_M$ by means of the location-calculating circuit 620 according to the formulas (6) and (7).

In addition, when the predetermined included angle $\theta_Y$ in the 3-point positioning device 600 is equal to $\pi$, the auxiliary positioning lines $L_{612}$ and $L_{623}$ are parallel to each other. Also, the structure and the principle of the 3-point positioning device 600 are similar to those of the 3-point positioning device 100. The formula (6) is similar to the formula (1) when the predetermined included angle $\theta_Y$ in the formula (6) is substituted by $\pi$. Thus, the 3-point positioning device 100 is an equivalent device corresponding to the 3-point positioning device 600 when the predetermined included angle is equal to $\pi$.

Figure 7:
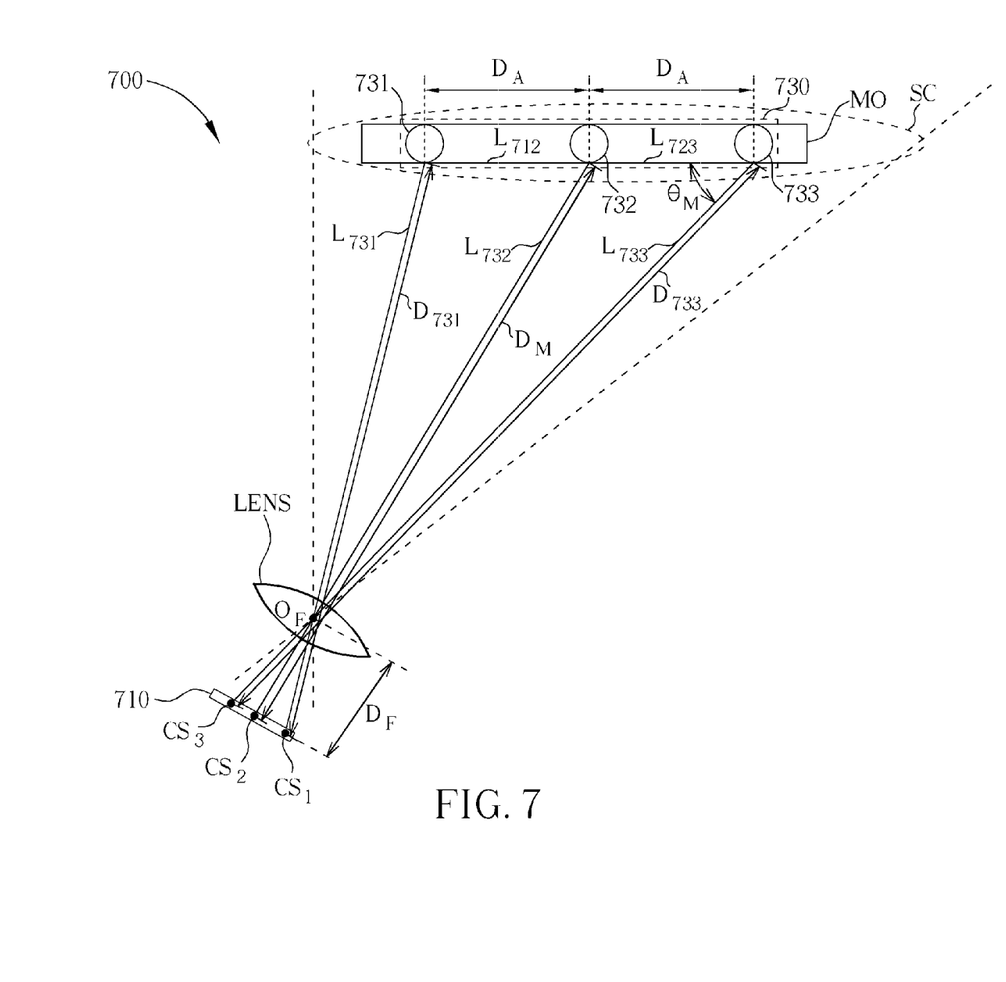
FIG. 7 is a diagram illustrating a 3-point positioning device according to the third embodiment of the present invention.

Please refer to FIG. 7. FIG. 7 is a diagram illustrating a 3-point positioning device 700 according to the third embodiment of the present invention. The 3-point positioning device 700 comprises an image sensor 710, a location-calculating circuit 720 (not shown in FIG. 7), and an auxiliary positioning module 730. The 3-point positioning device 700 is utilized for measuring a measured distance $D_M$ and a measured angle $\theta_M$ between the auxiliary positioning module 730 and the image sensor 710. When the auxiliary positioning module 730 and a measured object MO are disposed at the same location, the 3-point positioning device 700 can measure the measured distance $D_M$ and the measured angle $\theta_M$ between the measured object MO and the 3-point positioning device 700. The structure and the operation principle of the image sensor 710 are similar to the image sensors 610 and 110, and thus will not be repeated again for brevity. In addition, in FIG. 7, the lens LEN is utilized for focusing the light to the image sensor 710, so that the image sensor 710 can generate the sensed image I. The auxiliary positioning module 730 comprises auxiliary positioning units 731, 732, and 733. In the present embodiment, it is assumed that the auxiliary positioning units 731, 732, and 733 are disposed on the measured object MO. The lengths of the auxiliary position lines $L_{712}$ and $L_{723}$ are both equal to the predetermined distance $D_A$. The auxiliary positioning units 731, 732, and 733 are all LEDs (for example, the LEDs of the infrared light). The lights emitted by the auxiliary positioning units 731, 732, and 733 have the same power $PW_{LD}$. The lights emitted by the auxiliary positioning units 731, 732, and 733 are all isotropic. That is, the auxiliary positioning units 731, 732, and 733 emit light uniformly. In addition, in FIG. 7, since the distance between the sensing unit $CS_2$ and the auxiliary positioning unit 732 is approximately equal to the distance between the crossing point $O_F$ and the auxiliary positioning unit 732, the measured distance $D_M$ can represent not only the distance between the sensing unit $CS_2$ and the auxiliary positioning unit 732 but also the distance between the crossing point $O_F$ and the auxiliary positioning unit 732. Similarly, $D_{731}$ can represent not only the distance between the sensing unit $CS_1$ and the auxiliary positioning unit 731 but also the distance between the crossing point $O_F$ and the auxiliary positioning unit 731; $D_{733}$ can represent not only the distance between the sensing unit $CS_3$ and the auxiliary positioning unit 733 but also the distance between the crossing point $O_F$ and the auxiliary positioning unit 733. As a result, the powers $PW_{731}$, $PW_{732}$, and $PW_{733}$ of the received lights of the sensing units $CS_1$, $CS_2$, and $CS_3$, corresponding to the auxiliary positioning units 731, 732, and 733, which are respectively related to the distance $D_{731}$ between the sensor unit $CS_1$ and the auxiliary positioning units 731, the distance $D_M$ between the sensor unit $CS_2$ and the auxiliary positioning units 732, and the distance $D_{733}$ between the sensor unit $CS_3$ and the auxiliary positioning units 733, can be represented as the following formulas:

$$[(PW_{731}/PW_{LD})/(PW_{732}/PW_{LD})]=D_M^2/D_{731}^2 \quad (8);$$

$$[(PW_{733}/PW_{LD})/(PW_{732}/PW_{LD})]=D_M^2/D_{733}^2 \quad (9);$$

the distance $D_{731}$ is equal to $[D_M \times (PW_{732}/PW_{731})^{0.5}]$ according to the formula (8), and the distance $D_{733}$ is equal to $[D_M \times (PW_{732}/PW_{733})^{0.5}]$ according to the formula (9), wherein $(PW_{732}/PW_{731})$ and $(PW_{732}/PW_{733})$ can be obtained by means of the image signals $S_{I1}$, $S_{I2}$, and $S_{I3}$ of the sensed image I corresponding to the sensing units $CS_1$, $CS_2$, and $CS_3$. For example, the image signals $S_{I1}$, $S_{I2}$, and $S_{I3}$ respectively represent brightness $B_{731}$, $B_{732}$, and $B_{733}$. In this way, $(PW_{731}/PW_{732})$ is equal to $(B_{731}/B_{732})$, and $(PW_{733}/PW_{732})$ is equal to $(B_{733}/B_{732})$. Consequently, according to Apollonius' theorem and the triangle formed by the auxiliary positioning lines $L_{712}$ and $L_{723}$, and the projection lines $L_{731}$ and $L_{733}$, the measured distance $D_M$, the relation between the measure of the area of the triangle, and the distance $D_{731}$ and $D_{733}$ can be represented as the following formula:

$$(D_{731})^2+(D_{733})^2=2\times[(D_A)^2+(D_M)^2] \quad (10);$$

In this way, the location-calculating circuit 720 can calculate out the measured distance $D_M$ according to the formulas (8), (9), and (10). Moreover, the measured distance $D_M$, the distances $D_{731}$ and $D_{733}$, the predetermined distance $D_A$, and the measured angle $\theta_M$ can be represented as the following formula, according to Heron's formula and the triangle (formed by the auxiliary positioning lines $L_{712}$ and $L_{723}$, and the projection lines $L_{731}$ and $L_{733}$):

$$(\tfrac{1}{2})\times D_A \times D_{733}\times \sin\theta_M = [V\times(V-D_A)\times(V-D_{733})\times(V-D_M)] \quad (11);$$

wherein V is a half of the perimeter of the triangle (formed by the auxiliary positioning lines $L_{712}$ and $L_{723}$, and the projection lines $L_{731}$ and $L_{733}$), and V is equal to $[(\tfrac{1}{2})\times(D_A+D_M+D_{733})]$. In this way, the location-calculating circuit 720 can calculate out the measured angle $\theta_M$ according to the formula (11).

In addition, when the 3-point positioning device of the present invention is applied for the game console, the game console can provide a better interactive experience to the user. Take the above-mentioned tennis game for example. When the user holds the joystick having the image sensor of the 3-point positioning device of the present invention, and the auxiliary positioning module of the 3-point positioning device of the present invention and the measured object (for instance, the display or the displaying screen) are at the same location, the game console can obtain the measured distance $D_M$ and the measured angle $\theta_M$ between the user and the measured object. When the user moves, since the measured distance $D_M$ changes as well, the game console can accordingly control the role in the game corresponding to the user moving. When the user swings the joystick, since the measured angle $\theta_M$ changes as well, the game console can accordingly control the role in the game corresponding to the user swinging the tennis racket. In this way, the user can control the role moving and swinging the tennis racket by means of the 3-point positioning device applied in the joystick, and the user has a more realistic interactive experience.

In addition, it is noticeable that, in the 3-point positioning device of the present invention (for example, the 3-point positioning devices 100, 600, or 700), the measured distances between the image sensors 110, 610, and 710, and the auxiliary positioning modules 130, 630, and 730 do not have to be the distances between the sensing unit $CS_2$ and the auxiliary positioning units 132, 632, and 732. For example, the measured distanced can be the distances between the sensing unit $CS_1$ and the auxiliary positioning units 131, 631, and 731, or the distances between the sensing unit $CS_3$ and the auxiliary positioning units 133, 633, and 733. The measured distances still can be calculated out by means above-mentioned method at the time. Similarly, the measured angles between the image sensors 110, 610, and 710, and the auxiliary positioning modules 130, 630, and 730 do not have to be the included angles between the sensing unit $CS_3$ and the connecting lines formed by the sensing unit $CS_3$ and the auxiliary positioning units 133, 633, and 733. For example, the measured angles between the image sensors 110, 610, and 710, and the auxiliary positioning modules 130, 630, and 730, can be the included angles between the projection lines $L_{132}$, $L_{632}$, and $L_{732}$ (that is, the connecting lines between the sensing unit $CS_2$ and the auxiliary positioning units 132, 632, and 732) and the auxiliary positioning lines $L_{123}$, $L_{623}$, and $L_{723}$, the included angles between the projection lines $L_{132}$, $L_{632}$, and $L_{732}$ (that is, the connecting lines between the sensing unit $CS_2$ and the auxiliary positioning units 132, 632, and 732) and the auxiliary positioning lines $L_{112}$, $L_{612}$, and $L_{712}$, or the included angles between the projection lines $L_{131}$, $L_{631}$, and $L_{731}$ (that is, the connecting lines between the sensing unit $CS_1$ and the auxiliary positioning units 131, 631, and 731) and the auxiliary positioning lines $L_{112}$, $L_{612}$, and $L_{712}$. The measured angles still can be calculated out by means of the above-mentioned method at the time.

Figure 8:
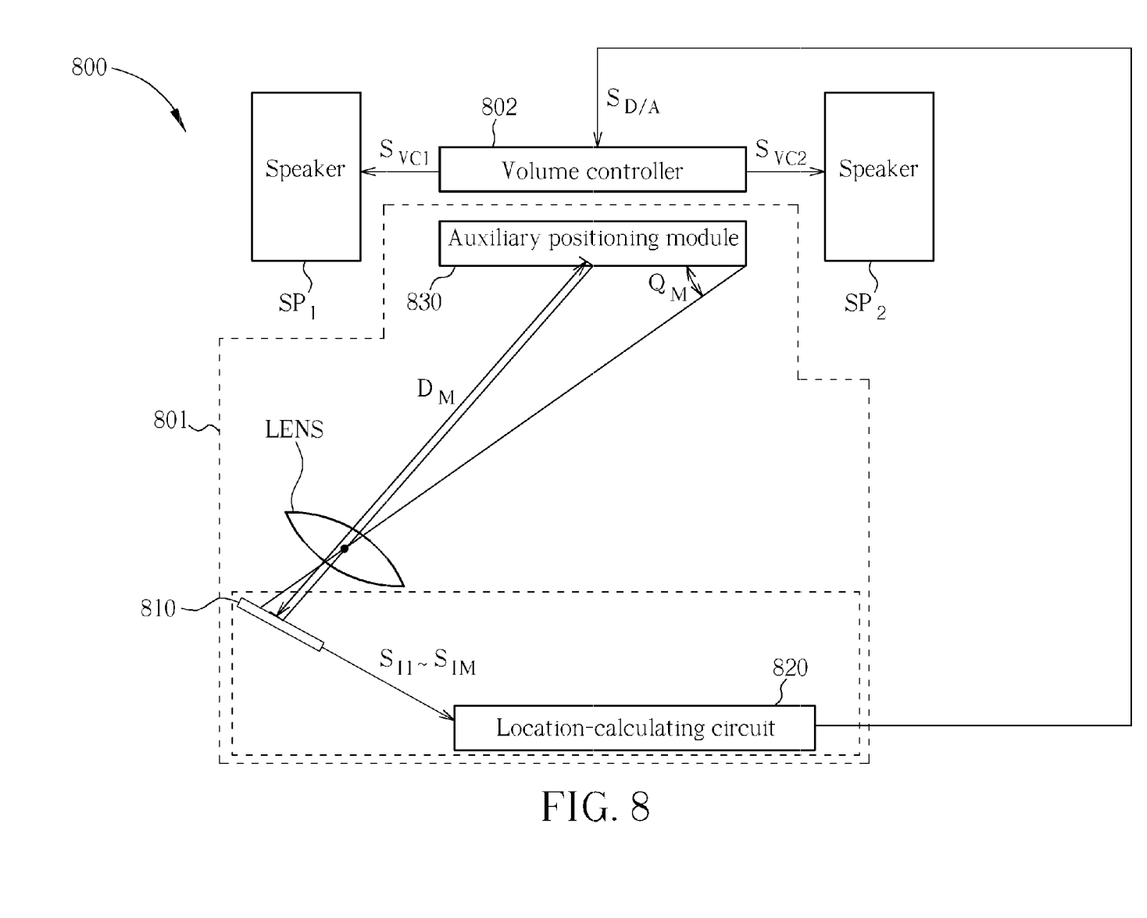
FIG. 8 is a diagram illustrating a speaker system of the present invention.

Please refer to FIG. 8. FIG. 8 is a diagram illustrating a speaker system 800 of the present invention. The speaker system 800 comprises a 3-point positioning device 801, a volume controller 802, and speakers $SP_1$ and $SP_2$. The structure and the operation principle of the 3-point positioning device 801 are similar to those of the 3-point positioning devices 100, 600 or 700, and will not be repeated again for brevity. The auxiliary positioning module 830 is disposed between the speakers $SP_1$ and $SP_2$. The location-calculated circuit 820 outputs the distance/angle signal $S_{D/A}$ according to the measured distance $D_M$ and the measured angle $\theta_M$. The volume controller 802 is utilized for receiving the distance/angle signal $S_{D/A}$ and outputting the volume-controlling signals $S_{VC1}$ and $S_{VC2}$ according to the measured distance $D_M$ and the measured angle $\theta_M$. The speakers $SP_1$ and $SP2_2$ are utilized for outputting voices and adjusting the volumes of the voices respectively according to the volume-controlling signals $S_{VC1}$ and $S_{VC2}$. For example, the image sensor 810 and the user are at the same location (for instance, the user holds a remote controller corresponding to the speaker system 800, and the image sensor 810 is disposed in the remote controller). Hence, when the location of the user changes, the volume controller 802 can adjust the volumes of the speakers $SP_1$ and $SP_2$ according to the location of the user (the location of the image sensor 810). The longer the measured distance $D_M$ between the user and the speakers, the more the volume controller 802 increases the volumes of the speakers; otherwise, the shorter the measured distance $D_M$ between the user and the speakers, the more the volume controller 802 decreases the volumes of the speakers. In this way, the volumes of the voices heard by the user do not vary with the location of the user. In addition, the volume controller 802 can determine if the user (the image sensor 810) and the speaker $SP_1$ (or $SP_2$) are at the same side of the auxiliary positioning module 830 or at different sides of the auxiliary positioning module 830 (as shown in FIG. 8, the user and the speaker $SP_1$ (or $SP_2$) are at the same side of the auxiliary positioning module 830). When the volume controller 802 determines the user and the speaker $SP_1$ are at the same side of the auxiliary positioning module 830, it represents that the distance between the user and the speaker $SP_1$ is shorter than the distance between the user and the speaker $SP_2$. Therefore, the volume controller 802 reduces the volume of the speaker $SP_1$ and raises up the volume of the speaker $SP_2$ for maintaining the stereo of the speaker system 800; otherwise, when the volume controller 802 determines the user and the speaker $SP_1$ are at different sides of the auxiliary positioning module 830, it represents that the distance between the user and the speaker $SP_1$ is longer than the distance between the user and the speaker $SP_2$. Therefore, the volume controller 802 raises up the volume of the speaker $SP_1$ and reduces the volume of the speaker $SP_2$ for maintaining the stereo of the speaker system 800.

In addition, as shown in FIG. 8, in the 3-point positioning device 801, the image sensor 810 and the location-calculating circuit 820 can be integrated into the same chip or realized in different chips. Similarly, in the 3-point positioning devices 100, 600, and 700, the image sensors 110, 610, and 710, and the location-calculating circuits 120, 620, and 720 can be integrated into the same chip or realized in different chips.

In conclusion, the 3-point positioning device provided by the present invention generates a sensed image by means of the image sensor sensing a scene including an auxiliary positioning module. The 3-point positioning device of the present invention recognizes the sensing units corresponding to the auxiliary positioning module according to the sensed image. Thus, the absolute location of the auxiliary positioning module can be calculated out according to the locations or the received powers of the sensing units corresponding to the auxiliary positioning module. In addition, the game console can provide the user the more realistic interactive experience according to the measured distance and the measured angle measured by the 3-point positioning device of the present invention. In addition, the speaker system provided by the present invention can adjust the volumes of the speakers according the location of the user for maintaining the stereo of the speaker system and the voices heard by the user do not vary with the location of the user, providing a great convenience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A 3-point positioning device, comprising:
    an auxiliary positioning module, comprising:
        a first auxiliary positioning unit;
        a second auxiliary positioning unit; and
        a third auxiliary positioning unit;
        wherein a first auxiliary positioning line is formed between the first auxiliary positioning unit and the second auxiliary positioning unit;
        wherein a length of the first auxiliary positioning line is equal to a first predetermined distance;
        wherein a second auxiliary positioning line is formed between the second auxiliary positioning unit and the third auxiliary positioning unit;
        wherein a length of the second auxiliary positioning line is equal to a second predetermined distance;
        wherein an included angle between the first and the second auxiliary positioning lines is a predetermined included angle;
    an image sensor, for sensing a scene having a range including the first, the second, and the third auxiliary positioning unit, and accordingly generating a sensed image;
        wherein the range of the scene is determined by a predetermined view angle of the image sensor; and
    a location-calculating circuit, for receiving the sensed image so as to recognize a first sensing unit of the image sensor corresponding to the first auxiliary positioning unit, a second sensing unit of the image sensor corresponding to the second auxiliary positioning unit, and a third sensing unit of the image sensor corresponding to the third auxiliary positioning unit, and calculating a measured distance and a measured angle between the auxiliary positioning module and the image sensor according to positions of the first, the second, and the third sensing units so as to accordingly output at least a distance signal or an angle signal.

2. The 3-point positioning device of claim 1, wherein the first, the second, and the third auxiliary positioning units are Light-Emitting Diodes (LED) having a specific wavelength or a specific frequency, or the first, the second, and the third auxiliary positioning units are objects having a specific pattern or a specific color.

3. The 3-point positioning device of claim 1, wherein a first projection line is formed between the first sensing unit and the first auxiliary positioning unit; a second projection line is formed between the second sensing unit and the second auxiliary positioning unit; a third projection line is formed between the third sensing unit and the third auxiliary positioning unit; the first, the second, and third projection lines cross with each other at a crossing point; the crossing point is projected at a middle point of the image sensor; a middle line is formed between the crossing point and the middle point of the image sensor; the middle line is perpendicular to a surface of the image sensor.

4. The 3-point positioning device of claim 3, wherein the location-calculating circuit calculated out the measured distance and the measured angle according to following formulas:

$$D_{612}/\sin\theta_{612}=D_m/\sin(2\times\pi-\theta_M-\theta_{612}-\theta_{623}-\theta_Y); \text{ and}$$

$$D_{623}/\sin\theta_{623}=DM/\sin\theta_M;$$

wherein $D_{612}$ represents the first predetermined distance; $D_{623}$ represents the second predetermined distance; $D_M$ represents the measured distance; $\theta_M$ represents the measured angle; $\pi$ represents a sum of three internal angles of a triangle; $\theta_{612}$ represents a first projection included angle between the first and the second projection lines; $\theta_{623}$ represents a second projection included angle between the second and the third projection lines; $\theta_Y$ represents the predetermined included angle.

5. The 3-point positioning device of claim 4, wherein the location-calculating circuit calculates out a first middle-line included angle between the first projection line and the middle line, a second middle-line included angle between the second projection line and the middle line, and a third middle-line included angle between the third projection line and the middle line according to following formulas:

$$\theta_A=\tan^{-1}[\tan(\theta_{FOV}/2)\times(D_{S1F}/D_{FOV/2})];$$

$$\theta_B=\tan^{-1}[\tan(\theta_{FOV}/2)\times(D_{S2F}/D_{FOV/2})]; \text{ and}$$

$$\theta_C=\tan^{-1}[\tan(\theta_{FOV}/2)\times(D_{S3F}/D_{FOV/2})];$$

wherein $\theta_A$ represents the first middle-line included angle; $\theta_B$ represents the second middle-line included angle; $\theta_C$ represents the third middle-line included angle; $D_{S1F}$ represents a distance between the middle point and the first sensing unit; $D_{S2F}$ represents a distance between the middle point and the second sensing unit; $D_{S3F}$ represents a distance between the middle point and the third sensing unit; $D_{FOV/2}$ represents a half of a width of the image sensor.

6. The 3-point positioning device of claim 5, wherein when the middle point is between the first and the second sensing units, the location-calculating circuit calculates out the first and the second projection included angles as following formulas:

$$\theta_{612}=\theta_A+\theta_B; \text{ and}$$

$$\theta_{623}=\theta_C-\theta_B.$$

7. The 3-point positioning device of claim 5, wherein when the middle point is between the second and the third sensing units, the location-calculating circuit calculates out the first and the second projection included angles as following formulas:

$$\theta_{612}=\theta_A-\theta_B; \text{ and}$$

$$\theta_{623}=\theta_C+\theta_B.$$

8. The 3-point positioning device of claim 5, wherein when the first, the second, and the third sensing units are at a same side of the middle point, and the first middle-line included angle is larger than second middle-line included angle, and the second middle-line included angle is larger than the third middle-line included angle, the location-calculating circuit calculates out the first and the second projection included angles as following formulas:

$$\theta_{612}=\theta_A-\theta_B; \text{ and}$$

$$\theta_{623}=\theta_B-\theta_C.$$

9. The 3-point positioning device of claim 5, wherein when the first, the second, and the third sensing units are at a same side of the middle point, and the third middle-line included angle is larger than the second middle-line included angle, and the second middle-line included angle is larger than the first middle-line included angle, the location-calculating circuit calculates out the first and the second projection included angles as following formulas:

$$\theta_{612}=\theta_B-\theta_A; \text{ and}$$

$$\theta_{623}=\theta_C-\theta_B.$$

10. The 3-point positioning device of claim 1, wherein the first predetermined distance is equal to the second predetermined distance; the predetermined included angle is equal to a sum of three internal angles of a triangle; the first, the second, and the third auxiliary positioning units are LEDs, and lights emitted by the first, the second, and the third auxiliary positioning units have a same power.

11. The 3-point positioning device of claim 10, wherein the location-calculating circuit calculates out the measured distance and the measured angle according to following formulas:

$$PW_{732}/PW_{731}=(D_{731})^2/(D_M)^2;$$

$$PW_{732}/PW_{733}=(D_{733})^2/(D_M)^2;$$

$$(D_{731})^2+(D_{733})^2=2\times[(D_A)^2+(D_M)^2];$$

$$(½)\times D_A\times D_{733}\times\sin\theta_M=[V\times(V-D_A)\times(V-D_{733})\times(V-D_M)]; \text{ and}$$

$$V=(½)\times(D_A\pm D_{733}+D_M);$$

wherein $D_M$ represents the measured distance; $\theta_M$ represents the measured angle; $D_A$ represents the first predetermined distance or the second predetermined distance; $D_{731}$ represents a distance between the first sensing unit and the first auxiliary positioning unit; $D_{733}$ represents a distance between the third sensing unit and the third auxiliary positioning unit; V represents a half of a perimeter of a triangle formed by the second auxiliary positioning line, the second projection line, and the third projection lines; $PW_{731}$ represents a power of a received light of the first sensing unit; $PW_{732}$ represents a power of a received light of the second sensing unit; $PW_{733}$ represents a power of a received light of the third sensing unit.

12. The 3-point positioning device of claim 10, wherein the measured distance is a distance between the first sensing unit and the first auxiliary positioning unit, a distance between the second sensing unit and the second auxiliary positioning unit, or a distance between the third sensing unit and the third auxiliary positioning unit; the measured angle is an included angle between a connecting line formed between the second sensing unit and the second auxiliary positioning unit, and the first auxiliary positioning line, an included angle between a connecting line formed between the second sensing unit and the second auxiliary positioning unit, and the second auxiliary positioning line, a included angle between a connecting line formed between the first sensing unit and the first auxiliary positioning unit, and the first auxiliary positioning line, or an included angle between a connecting line formed between the third sensing unit and the third auxiliary positioning unit, and the second auxiliary positioning line.

13. A speaker system, comprising:
  a 3-point positioning device of claim 1;
  a first speaker, for outputting a voice according to a first volume-controlling signal;
  a second speaker, for outputting a voice according to a second volume-controlling signal; and
  a volume controller, for receiving the distance signal and the angle signal, and outputting the first and the second volume-controlling signals according to the measured distance and the measured angle for adjusting volumes of the voices outputted by the first and the second speakers.

14. The speaker system of claim 13, wherein the longer the measured distance is, the more the volume controller increases the volumes of the voices outputted by the first and the second speakers; the shorter the measured distance is, the more the volume controller decreases the volumes of the voices outputted by the first and the second speakers.

15. The speaker system of claim 13, wherein the auxiliary positioning module is disposed between the first and the second speakers; when the volume controller determines that the image sensor and the first speaker at a same side of the auxiliary positioning module according to the measured distance and the measured angle, the volume controller decreases the volume of the voice outputted by the first speaker and the increases the volume of the voice outputted by the second speaker; when the volume controller determines that the image sensor and the first speaker at different sides of the auxiliary positioning module according to the measured distance and the measured angle, the volume controller increases the volume of the voice outputted by the first speaker and the decreases the volume of the voice outputted by the second speaker.

16. A method of 3-point positioning, comprising:
  providing a first, a second, and a third auxiliary positioning units of an auxiliary positioning module, and an image sensor;
    wherein a first auxiliary positioning line is formed between the first auxiliary positioning unit and the second auxiliary positioning unit;
    wherein a length of the first auxiliary positioning line is equal to a first predetermined distance;
    wherein a second auxiliary positioning line is formed between the second auxiliary positioning unit and the third auxiliary positioning unit;
    wherein a length of the second auxiliary positioning line is equal to a second predetermined distance;
    wherein an included angle between the first and the second auxiliary positioning lines is a predetermined included angle;
  the image sensor sensing a scene for generating a sensed image;
    wherein the first, the second, and the third auxiliary positioning units are in a range of the scene;
  recognizing a first sensing unit of the image sensor corresponding to the first auxiliary positioning unit, a second sensing unit of the image sensor corresponding to the second auxiliary positioning unit, and a third sensing unit of the image sensor corresponding to the third auxiliary positioning unit, according to the sensed image; and
  calculating out a measured distance and a measured angle between the image sensor and the auxiliary positioning module according to the first, the second, and the third sensing units.

17. The method of claim 16, wherein the first, the second, and the third auxiliary positioning units are LEDs having a specific wavelength or a specific frequency, or the first, the second, and the third auxiliary positioning units are objects having a specific pattern or a specific color.

18. The method of claim 17, wherein a first projection line is formed between the first sensing unit and the first auxiliary positioning unit; a second projection line is formed between the second sensing unit and the second auxiliary positioning unit; a third projection line is formed between the third sensing unit and the third auxiliary positioning unit; the first, the second, and third projection lines cross with each other at a crossing point; the crossing point is projected at a middle point of the image sensor; a middle line is formed between the crossing point and the middle point of the image sensor; the middle line is perpendicular to a surface of the image sensor; the range of the scene is determined by a predetermined view angle of the image sensor.

19. The method of claim 18, wherein calculating out the measured distance and the measured angle between the image sensor and the auxiliary positioning module according to the first, the second, and the third sensing units comprises:
  calculating out a first middle-line included angle between the first projection line and the middle line, a second middle-line included angle between the second projection line and the middle line, and a third middle-line included angle between the third projection line and the middle line, according the predetermined view angle, the middle line, and the first, the second, and the third sensing units;
  calculating out a first projection included angle between the first and the second projection lines, and a second projection included angle between the second and the third projection lines, according to the first, the second, and the third middle-line included angles; and
  calculating out the measured distance and the measured angle, according to the predetermined angle, the first predetermined distance, the second predetermined distance, the first projection included angle, and the second projection included angle.

20. The method of claim 19, wherein the measured distance and the measured angle is calculated out according to following formulas:

$$D_{612}/\sin\theta_{612} = D_M/\sin(2\times\pi - \theta_M - \theta_{612} - \theta_{623} - \theta_Y); \text{ and}$$

$$D_{623}/\sin\theta_{623} = DM/\sin\theta_M;$$

wherein $D_{612}$ represents the first predetermined distance; $D_{623}$ represents the second predetermined distance; $D_M$ represents the measured distance; $\theta_M$ represents the measured angle; π represents a sum of three internal angles of a triangle; $\theta_{612}$ represents a first projection included angle between the first and the second projection lines; $\theta_{623}$ represents a second projection included angle between the second and the third projection lines; $\theta_Y$ represents the predetermined included angle.

21. The method of claim 20, wherein the first, the second, and the third middle-line included angles are calculated out according to following formulas:

$$\theta_A = \tan^{-1}[\tan(\theta_{FOV}/2)\times(D_{S1F}/D_{FOV/2})];$$

$$\theta_B = \tan^{-1}[\tan(\theta_{FOV}/2)\times(D_{S2F}/D_{FOV/2})]; \text{ and}$$

$$\theta_C = \tan^{-1}[\tan(\theta_{FOV}/2)\times(D_{S3F}/D_{FOV/2})];$$

wherein $\theta_A$ represents the first middle-line included angle; $\theta_B$ represents the second middle-line included angle; $\theta_C$ represents the third middle-line included angle; $D_{S1F}$ represents a distance between the middle point and the first sensing unit; $D_{S2F}$ represents a distance between the middle point and the second sensing unit; $D_{S3F}$ represents a distance between the middle point and the third sensing unit; $D_{FOV/2}$ represents a half of a width of the image sensor.

22. The method of claim 21, wherein when the middle point is between the first and the second sensing units, the first and the second projection included angles are calculated out according to following formulas:

$\theta_{612} = \theta_A + \theta_B$; and $\theta_{623} = \theta_C - \theta_B$.

23. The method of claim 21, wherein when the middle point is between the second and the third sensing units, the first and the second projection included angles are calculated out according to following formulas:

$\theta_{612} = \theta_A - \theta_B$; and $\theta_{623} = \theta_C + \theta_B$.

24. The method of claim 21, wherein when the first, the second, and the third sensing units are at a same side of the middle point, and the first middle-line included angle is larger than second middle-line included angle, and the second middle-line included angle is larger than the third middle-line included angle, the first and the second projection included angles are calculated out according to following formulas:

$\theta_{612} = \theta_A - \theta_B$; and $\theta_{623} = \theta_B - \theta_C$.

25. The method of claim 21, wherein when the first, the second, and the third sensing units are at a same side of the middle point, and the third middle-line included angle is larger than second middle-line included angle, and the second middle-line included angle is larger than the first middle-line included angle, the first and the second projection included angles are calculated out according to following formulas:

$\theta_{612} = \theta_B - \theta_A$; and $\theta_{623} = \theta_C - \theta_B$.

26. The method of claim 16, wherein the first predetermined distance is equal to the second predetermined distance; the predetermined included angle is equal to a sum of three internal angles of a triangle; the first, the second, and the third auxiliary positioning units are LEDs, and lights emitted by the first, the second, and the third auxiliary positioning units have a same power.

27. The method of claim 26, wherein the measured distance and the measured angle are calculated out according to following formulas:

$PW_{732}/PW_{731} = (D_{731})^2/(D_M)^2$;

$PW_{732}/PW_{733} = (D_{733})^2/(D_M)^2$;

$(D_{731})^2 + (D_{733})^2 = 2 \times [(D_A)^2 + (D_M)^2]$;

$(1/2) \times D_A \times D_{733} \times \sin \theta_M = [V \times (V - D_A) \times (V - D_{733}) \times (V - D_M)]$; and $V = (1/2) \times (D_A \pm D_{733} + D_M)$;

wherein $D_M$ represents the measured distance; $\theta_M$ represents the measured angle; $D_A$ represents the first predetermined distance or the second predetermined distance; $D_{731}$ represents a distance between the first sensing unit and the first auxiliary positioning unit; $D_{733}$ represents a distance between the third sensing unit and the third auxiliary positioning unit; V represents a half of a perimeter of a triangle formed by the second auxiliary positioning line, the second projection line, and the third projection lines; $PW_{731}$ represents a power of a received light of the first sensing unit; $PW_{732}$ represents a power of a received light of the second sensing unit; $PW_{733}$ represents a power of a received light of the third sensing unit.

28. The method of claim 16, wherein the measured distance is a distance between the first sensing unit and the first auxiliary positioning unit, a distance between the second sensing unit and the second auxiliary positioning unit, or a distance between the third sensing unit and the third auxiliary positioning unit; the measured angle is an included angle between a connecting line formed between the second sensing unit and the second auxiliary positioning unit, and the first auxiliary positioning line, a included angle between a connecting line formed between the second sensing unit and the second auxiliary positioning unit, and the second auxiliary positioning line, an included angle between a connecting line formed between the first sensing unit and the first auxiliary positioning unit, and the first auxiliary positioning line, or an included angle between a connecting line formed between the third sensing unit and the third auxiliary positioning unit, and the second auxiliary positioning line.

29. A 3-point positioning device, comprising:
an auxiliary positioning module, set on an object, the auxiliary positioning module comprising:
  a first auxiliary positioning unit, set on the object;
  a second auxiliary positioning unit, set on the object, wherein a first auxiliary positioning line is formed between the first auxiliary positioning unit and the second auxiliary positioning unit, and a length of the first auxiliary positioning line is equal to a first predetermined distance between the first auxiliary positioning unit and the second auxiliary positioning unit; and
  a third auxiliary positioning unit set on the object, wherein a second auxiliary positioning line is formed between the second auxiliary positioning unit and the third auxiliary positioning unit, a length of the second auxiliary positioning line is equal to a second predetermined distance between the second auxiliary positioning unit and the third auxiliary positioning unit, and an included angle between the first and the second auxiliary positioning lines is a predetermined included angle;
an image sensor, for sensing a scene having a range including the first, the second, and the third auxiliary positioning unit, and accordingly generating a sensed image, wherein the range of the scene is determined by a predetermined view angle of the image sensor; and
a location-calculating circuit, for receiving the sensed image so as to recognize a first sensing unit of the image sensor corresponding to the first auxiliary positioning unit, a second sensing unit of the image sensor corresponding to the second auxiliary positioning unit, and a third sensing unit of the image sensor corresponding to the third auxiliary positioning unit, and calculating a measured distance and a measured angle between the auxiliary positioning module and the image sensor according to positions of the first, the second, and the third sensing units so as to accordingly output at least a distance signal or an angle signal.

30. The 3-point positioning device of claim 29, wherein the first, the second, and the third auxiliary positioning units are used for providing light beams or reflecting light beams so as to be sensed by the image sensor.

* * * * *